United States Patent
Wang et al.

(10) Patent No.: US 6,930,004 B2
(45) Date of Patent: Aug. 16, 2005

(54) SELF-ALIGNED DRAIN/CHANNEL JUNCTION IN VERTICAL PASS TRANSISTOR DRAM CELL DESIGN FOR DEVICE SCALING

(75) Inventors: Geng Wang, Beacon, NY (US); Kevin Mcstay, Hopewell Junction, NY (US); Mary Elizabeth Weybright, Pleasant Valley, NY (US); Yujun Li, Poughkeepsie, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 10/604,731

(22) Filed: Aug. 13, 2003

(65) Prior Publication Data

US 2005/0037561 A1 Feb. 17, 2005

(51) Int. Cl.[7] .............................................. H01L 21/336
(52) U.S. Cl. ........................ 438/268; 438/270; 438/282; 438/290; 438/291; 438/525; 438/527
(58) Field of Search .................................. 438/268, 270, 438/272, 282, 290, 291, 525, 527

(56) References Cited

U.S. PATENT DOCUMENTS 5,548,148 A * 8/1996 Bindal ......................... 257/335

| 6,414,347 | B1 | 7/2002 | Divakaruni |
| 6,440,793 | B1 | 8/2002 | Divakaruni |
| 6,740,920 | B2 * | 5/2004 | Chidambarrao et al. ..... 257/302 |
| 2002/0096219 | A1 | 7/2002 | Frasure |

OTHER PUBLICATIONS

"Vertical Pass Transistor Design For Sub–100nm DRAM Technologies" K. McStay, et al., Proceedings 2002 Symposium on VLSI Technology, Section 18.3, pp 180–181 Jun. 11, 2002.

* cited by examiner

Primary Examiner—Trung Dang
(74) Attorney, Agent, or Firm—Graham S. Jones; H. Daniel Schnurmann

(57) ABSTRACT

A method of formation of a deep trench vertical transistor is provided. A deep trench with a sidewall in a doped semiconductor substrate is formed. The semiconductor substrate includes a counterdoped drain region in the surface thereof and a channel alongside the sidewall. The drain region has a top level and a bottom level. A counterdoped source region is formed in the substrate juxtaposed with the sidewall below the channel. A gate oxide layer is formed on the sidewalls of the trench juxtaposed with a gate conductor. Perform the step of recessing the gate conductor below the bottom level of the drain region followed by performing angled ion implantation at an angle $\theta+\delta$ with respect to vertical of a counterdopant into the channel below the source region and performing angled ion implantation at an angle $\theta$ with respect to vertical of a dopant into the channel below the source.

20 Claims, 10 Drawing Sheets

SELF-ALIGNED DRAIN/CHANNEL JUNCTION IN VERTICAL PASS TRANSISTOR DRAM CELL DESIGN FOR DEVICE SCALING

BACKGROUND OF INVENTION

This invention relates to the fabrication of Vertical Metal-Oxide-Semiconductor Field Effect Transistors (MOSFETs), which provide improved threshold variation and offer channel length scalability superior to devices existing in the prior art.

In DRAM (Dynamic Random Access Memory) devices, a transfer MOSFET device is employed as a switch connected to the charge storing capacitor. A DRAM circuit usually includes an array of memory cells interconnected by rows known as wordlines and columns known as bitlines. Reading data from or writing data to a particular memory cell in the DRAM is achieved by simultaneously activating the combination of a selected wordline and a selected bitline. Different types of MOSFETs are used in DRAM circuits.

FIG. 1A is a fragmentary, schematic, vertical sectional elevational view of a prior art vertical, deep trench, MOSFET, DRAM cell 10 formed in a P− doped silicon substrate 15. The cell 10 includes a vertical MOSFET transistor 17 in which the plane of channel current flow is parallel to the primary surface of the P− doped silicon substrate 15. On the right side of cell 10, a deep trench DT has been formed in the substrate 15, with the right edge of the deep trench DT and the substrate 15 excluded from the view for convenience of illustration.

The MOSFET transistor 17, which is formed along the left sidewall of the deep trench DT includes a gate oxide layer 24 formed on the sidewall of the deep trench DT juxtaposed with a gate conductor (GC) 16 formed at the top of the trench DT. A capacitor C is formed in the lower portion of the deep trench DT.

The FET transistor 17 includes a drain region D, a source region S, and a channel CH. The drain region D is located in an N+ doped bit line diffusion (XA) region 26 on top of the substrate 15. The source region S is formed in an N+ doped outdiffusion region OD, which is juxtaposed with an N+ doped strap 13 formed in the deep trench DT, at the top of an N+ doped capacitor node 11. The channel CH of the FET transistor 17 is located in the P− doped substrate 15 to the left of the gate oxide layer 24 formed along the upper sidewall of the deep trench DT, with the channel region CH of transistor 17 located between the drain region D and the source region 5, from top to bottom. Thus the channel CH and the gate conductor 16 are separated, as stated above, by the thin gate oxide layer 24, which is formed on the sidewall of the deep trench DT with the drain region D at the top of the channel CH and the source region S at the bottom of the channel CH in the vertical transistor 17. The transistor 17 is turned on when the gate conductor (GC) 16 is raised to Vpp by electrical connection of wiring thereto (not shown) at the top of the GC 16.

In this vertical MOSFET transistor 17, the current flow is perpendicular with respect to the primary (i.e. horizontal as shown in FIG. 1) surface of the silicon substrate 15 through the channel CH between the source region S and the drain region D.

The deep trench capacitor C (comprising a three-dimensional structure), which is formed in the lower portion of the deep trench DT, is used as the charge storing capacitor C of the MOSFET cell 10. As will be well understood by those skilled in the art, such a deep trench capacitor C is normally formed by the process of etching vertical deep trenches DT of various dimensions into a semiconductor substrate, such as doped silicon substrate 15. As usual, the bottom of the deep trench DT contains N+ doped polysilicon, which serves as the storage node 11 of the capacitor C, with the storage node 11 comprising the inner plate of the capacitor C separated from the substrate 15 by dielectric layers 12/44. The bottom of the deep trench DT is shown with intermediate portions cut away near the bottom of FIG. 1A.

Prior to forming the storage node 11 of the capacitor C, an N+ doped region comprising the outer plate 42 of the capacitor is formed in the P− doped silicon substrate 15 deep trench DT when it is empty, i.e. before forming the storage node 11 by filling the deep trench DT with doped polysilicon. At that time, N+ dopant from a dopant source is introduced into the inside of the empty deep trench DT (with suitable masking as will be well understood by those skilled in the art). Then, when the N type dopant from the dopant source reaches the bottom of the deep trench DT, it is caused to diffuse therefrom outwardly from the bottom of the deep trench DT into the P− doped silicon substrate 15. In that way, an N+ doped outer plate 42 of the capacitor C is formed outside of the lower end of the deep trench DT, as indicated in FIG. 1A.

After forming the outer plate 42, a thin conformal layer of the storage node dielectric 44 is formed inside the deep trench DT on the exposed inner walls of the lower portion of the deep trench DT. Then a lower portion of the capacitor storage node 11 is formed inside the storage node dielectric 44. In short, the outer plate 42 surrounds the lower part of the deep trench DT, the storage node dielectric 44 and the lower portion of the capacitor storage node 11, in that order.

Above the level of the storage node dielectric 44, a LOCOS dielectric collar 12 is formed in the deep trench DT as a thin conformal layer (somewhat thicker than the storage node dielectric 44) on the outer walls of the deep trench DT. The collar 12 is far shorter than the capacitor C, which is shown on a reduced vertical scale for convenience of illustration.

The N+ doped polysilicon of the capacitor storage node 11 fills the deep trench DT inside storage node dielectric 44 and the capacitor dielectric collar 12 thereby completing formation of the capacitor C. A vertical trench transistor, such as transistor 17, can overcome the scalability limitations in planar transistors, since the channel length of the channel CH of transistor 17 is not defined and limited by lithography. A longer channel CH can be used to suppress the disadvantages of the short channel effect, which is a problem for planar transistors.

At the top surface of the cell 10, the N+ doped bit line diffusion (XA) region 26 (which is the drain region D) is formed in the top surface of the P− doped silicon substrate 15. A bitline contact 28 makes contact with the top surface of the XA region 26.

As indicated above, the source region S of transistor 17 comprises an N+ doped, buried-strap, out-diffusion region OD. The buried-strap, out-diffusion region OD is formed by out-diffusion of N type dopant from the N+ doped buried strap 13 at the top of the capacitor storage node 11, in a conventional process as will be well understood by those skilled in the art.

The collar 12 consisting of a dielectric such as silicon oxide helps to shut off the parasitic leakage path from the capacitor storage node 11 to the buried plate 42 outside the deep trench DT, the storage node dielectric 44 and the collar 12. A Trench Top Oxide (TTO) layer 14 isolates the capacitor storage node 11 from the N+ doped polysilicon of the gate conductor (GC) 16.

The vertical pass transistor cell 10 of FIG. 1A provides an attractive alternative to conventional, planar, DRAM pass transistor design and scaling. As stated above, the short channel effect is suppressed since a longer device effective channel length can be used which is not defined by lithography. The drive current is not impacted because two pass transistors 17 (only one of which is shown for convenience of illustration) are used in parallel to drive the storage capacitor C. The incorporation of the third dimension which is implicit in the vertical transistor design allows great flexibility in designing DRAM pass transistors 17 that are optimized for DRAM operations. However, there are concerns that need to be addressed as well.

One of the problems with previous designs of the vertical pass transistors 17 was that there was a large substrate bias effect that degraded the write back current. A graded doping profile in the direction perpendicular to the channel CH is required to achieve a small substrate bias effect. In the planar pass transistor design, this is naturally achieved with a blanket Vt adjustment implant.

In the vertical pass transistor cell 10 of FIG. 1A, a similar blanket implant illustrated by implanting dopant 32 in FIG. 1B leads to laterally uniform doping and hence high substrate sensitivity of the P− doped silicon substrate 15. In FIG. 1B, the gate electrode 16 is masked by an array top oxide 29 and the P− type dopant 32 is ion implanted vertically into the channel region CH to provide a Vt adjustment implant therein. The dopant is implanted directly into the channel region CH vertically and is therefore laterally uniform.

FIG. 2A illustrates a prior art angled ion implantation approach to solving the problem illustrated by FIGS. 1A and 1B, wherein the device structure and the Vt adjustment implant for improved substrate sensitivity and write back current are enhanced by angled ion implantation of boron ions 32 implanted diagonally at an angle θ with respect to the vertical (normal to the top surface of the cell 10) by ion implantation. During the angled ion implantation of ions 32, the bit line diffusion (XA) region 26 is shown as being protected from implantation of ions 32 by a masking layer 59.

FIG. 2A illustrates a solution to the problem of the process of FIG. 1B, which is to perform on the cell 10 of FIG. 1A, an angled Vt adjustment ion implantation of P type dopant ions into and through a recessed gate conductor 16 composed of N+ doped polysilicon.

In FIG. 2A, a prior art approach is used, in an attempt to achieve the desired doping profile. The P− type dopant ions 32 are implanted through the recess R by angled ion implanting ions 32 of P− type dopant at an angle θ into the corner of the channel CH partially through the recessed polysilicon of the gate conductor GC 16 into the channel CH. To achieve a successful dopant profile in the channel CH, gate conductor 16 must have been recessed to the correct depth by etching away a portion of N+ doped polysilicon fill to form a recess R. The problem associated with this approach is that the location of the peak of the implanted P− type dopant 32 is defined by the depth of the recess R formed by recessing the polysilicon of the GC 16, which has significant process variation. The junction with the bitline diffusion (XA) region 26 is thus not self-aligned to the gate conductor 16.

Ideally, the P− type doping into the channel CH should peak just below the junction 25 between bitline diffusion (XA) region 26 and P− doped silicon substrate 15 to taper off in both lateral and vertical directions, as shown by the doping profiles 18/19 in FIG. 2B and FIG. 2C.

Referring to FIG. 2B, the cell 10 of FIG. 1A is shown after the process of angled ion implantation of P type dopant ions performed in FIG. 2A has resulted in lateral scattering of the implanted P type dopant atoms illustrated by a solid profile line 18P' marked with a horizontal arrow. The scattering of the dopant atoms, combined with diffusion of the dopant atoms in the region of the channel CH and to the left thereof, creates a laterally graded profile 18P' (from right to left) of P− type dopant as shown in FIG. 2B with a peak on the right near the gate oxide layer 24 trailing down to a low concentration to the left.

Referring to FIG. 2C, there is also a solid, vertically graded profile line of P− type dopant 18P" produced by the process illustrated by FIG. 2A. The cell 10 is shown after the process of angled ion implantation of dopant atoms performed in FIG. 2A has resulted in vertical scattering of the implanted dopant atoms combined with diffusion in the region of the channel CH and therebelow, which creates a vertically graded profile 18P" (from top to bottom) of P-type dopant atoms as shown in FIG. 2 (with a peak spaced on the right near the gate oxide layer 24 a preferred distance "m" below the line 25 at the bottom of the XA region 26 trailing down to substantially lower concentrations thereabove and therebelow.

However, FIG. 2C also shows a hypothetical dotted profile line of a graded vertical profile of P− type dopant 18P'" caused by too shallow a recessing of the gate conductor 16. If the actual depth of the recessed gate conductor 16 is at the level of the hypothetical dotted line level 30, a distance n above the level 40, then as shown by the dotted line curve 18P'" in FIG. 2C, the result will be that the maximum of the vertical profile of the P− type dopant will be only the distance m−n below the line 25, which is too close to the lower boundary 25 of the XA region 26. That is undesirable since the Vt implant will be too high, i.e. in too close proximity to the drain region D in XA region 26, and P− type dopant will be compensated by N+ dopant atoms in the region 26. Thus the deep trench vertical DRAM processes can be faced with additional Vt variation due to problems in controlling the actual depth of the gate recess level 40.

Accordingly, due to process variations it can be expected that the hypothetical excessively high gate recess level 30 can be produced during manufacturing due to process variations and channel length scaling challenges. In summary, the dotted line gate recess level 40 is acceptable, but the gate recess level 30 is at an unacceptably high level. The problem is what to do to avoid this result.

FIG. 2D shows a desirable composite "three-dimensional" profile 18P" (vertical and horizontal distribution) of the concentration levels of the P type dopant atoms implanted in the step illustrated by FIG. 2A with the gate conductor 16 recessed to the level 40 shown in FIGS. 2A and 2B. This illustrates a desirable distribution of the dopant. However, that is only because the gate conductor 16 has been recessed sufficiently, as desired, unlike the unacceptable result shown by the profile 18" in FIGS. 2C and 2E.

As in FIG. 2C, FIG. 2E shows the undesirable profile 18P'" in the form of a composite "three-dimensional" (vertical and horizontal distribution) of the concentration levels of the P type dopant atoms implanted in the step illustrated by FIG. 2A, but with the gate conductor 16 recessed to the hypothetical dotted line level 30 at which the gate recess level 30 is at an unacceptably high level.

As shown by the doping profile 18'' in FIGS. 2C and 2E, if a GC recess 30 of GC 16 is too shallow, a significant portion of the P− type doping profile 19 is compensated by diffusion of the P type dopant 32, directly leading to a device threshold voltage drop. In such a design regime, in order to maintain a low value of sub-threshold leakage current, the designer is forced to raise the nominal Vt thereby degrading nominal drive current. If nominal Vt were kept the same, the P− type doping would be required to be placed deeper to minimize compensation by XA diffusion. However, the tail of the P− type dopant ion should not touch the strap out-diffusion OD, which would cause elevated junction leakage. As a result, the node diffusion defined by another recess needs to be deeper as well. In other words, the device channel length cannot be scaled to increase the drive current. This invention provides a means of reducing Vt variation and enabling further device channel length scaling in vertical trench MOSFETs.

Commonly assigned U.S. Pat. Nos. 6,414,347 and 6,440,793 of Ramachandra Divakaruni et al. entitled "Vertical MOSFET" describe making a vertical MOSFET structure by the following steps. Provide a vertical MOSFET DRAM cell structure having a deposited Gate Conductor (GC) layer planarized to a top surface of a Trench Top Oxide (TTO) on the overlying silicon substrate. Form a recess in the GC layer below the top surface of the silicon substrate. Implant N-type dopant species through the recess at an angle to form doping pockets in the array P-well. Deposit an oxide layer into the recess and etch the oxide layer to form spacers on sidewalls of the recess. Then deposit a GC material into the recess and planarize the GC to the top surface of the TTO.

Copending, commonly assigned, U.S. patent application of Dureseti Chidambarrao et al. entitled "Vertical MOSFET with Horizontally Graded Channel Doping", Ser. No. 10/096,219; filed 11 Mar. 2002, now U.S. Pat. No. 6,740,920 describes body effects in vertical MOSFET transistors which are considerably reduced with other device parameters unaffected wherein the vertical transistor has a threshold implant with a peak at the gate and an implant concentration distribution that declines rapidly away from the gate to a plateau having a low P-well concentration value. In one embodiment two body implants both of which involve counterdoping are employed with an angled ion implantation having a peak at the gate that sets the Vt and a laterally uniform low dose implant that sets the well dopant concentration.

"Vertical Pass Transistor Design For Sub-100 nm DRAM Technologies" K. McStay et al, VLSI Technical Digest; Proceedings of 2002 Symposium on VLSI Technology, Section 8-3, pages 180–181, Jun. 11, 2002.

SUMMARY OF INVENTION

An advantage of the method of this invention is that the Vt variation is greatly reduced due to gate recess control. In addition, this method offers more room for scaling channel length of the vertical pass transistor to ensure the desired drive current.

In accordance with this invention, two different ion implants self-aligned to a recessed gate conductor (GC) edge are employed to form the source junction Vt adjustment implant. The two different ion implants comprise an ion implant of P-type dopant ions implanted at an angle $\theta$ and an implant of N-type dopant implanted an angle $\theta+\delta$. The Vt variation due to recess control is suppressed and a lower Vt adjustment implant energy can be used, thus enabling further scaling of the vertical pass transistor. Preferably, the angle $\theta$ is about 7° and $\theta+\delta$ is about 30°.

Further in accordance with this invention, a method is provided for formation of a trench vertical transistor in a semiconductor substrate having a surface and a trench with a sidewall formed in said semiconductor substrate. The semiconductor substrate is doped with a dopant, a counterdoped drain region in the surface of said substrate and a channel along-side said sidewall, said drain region having a top level and a bottom level, a counterdoped source region formed in the substrate juxtaposed with said sidewall below said channel, a gate oxide layer formed on the sidewalls of said trench, and a gate conductor formed in said trench. The method includes the following steps. Recess the gate conductor below the surface of the semiconductor substrate. Perform angled ion implantation at an angle $\theta+\delta$ with respect to vertical of a counterdopant into the channel below the location of the drain region. Perform angled ion implantation at an angle $\theta$ with respect to vertical of a dopant into the channel below the location of the drain region.

Preferably, the recessing of the gate conductor reaches below the bottom level of the drain region, the angle $\theta$ is about 7° and $\theta+\delta$ is about 30°, the counterdopant is selected from the group consisting of arsenic and phosphorus, the counterdopant comprises arsenic ions implanted at an energy of about 10 keV, and/or the deep trench includes a deep trench capacitor Further in accordance with this invention, a method is provided for formation of a deep trench vertical transistor in a semiconductor substrate having a surface and a trench with a sidewall formed in the semiconductor substrate, the deep trench including a deep trench capacitor filled with a node, a strap, a collar and a node dielectric lining the deep trench, and a buried plate formed in the semiconductor substrate surrounding the deep trench, the semiconductor substrate being doped with a dopant, a counterdoped bit line diffusion region in the surface of the substrate and a channel alongside the sidewall, the bit line diffusion region having a top level and a bottom level, a counterdoped source region formed in the substrate juxtaposed with the sidewall below the channel, a gate oxide layer formed on the sidewalls of the trench, and a gate conductor formed in the trench. The method includes the following steps. Recess the gate conductor below the surface of the semi-conductor substrate. Perform angled ion implantation at a greater angle $\theta+\delta$ with respect to vertical of a counterdopant into the channel below the location of the drain region and perform angled ion implantation at a lesser angle $\theta$ with respect to vertical of a dopant into the channel below the location of the bit line diffusion region. Preferably, the recessing of the gate conductor reaches below the bottom level of the bitline diffusion region.

Further in accordance with this invention, a method of formation of a deep trench vertical transistor in a semiconductor substrate having a surface and a deep trench with a sidewall formed in the semiconductor substrate and a bit line diffusion region juxtaposed therewith on the surface of the semiconductor substrate is provided. The steps include as follows:

Form a deep trench having a top and a lower portion in a doped semiconductor substrate. Form a counterdoped buried plate in the substrate surrounding the lower portion of the deep trench. Form a storage node dielectric layer as a conformal thin film on inner walls of the deep trench. Fill the deep trench with an initial storage node conductor which is counterdoped. Recess the initial storage conductor. Form a dielectric collar as a conformal film on exposed inner walls of the deep trench with the dielectric collar recessed below the top of the deep trench. Fill the deep trench with a complementary storage node conductor which is counterdoped above and in contact with the initial storage conductor. Recess the complementary storage node conductor to a buried strap level in the deep trench. Form a counterdoped buried strap counterdoped outdiffusion by diffusion of dopant from the complementary storage node conductor into the substrate. Form a trench top oxide layer over the complementary storage node conductor. Form a gate oxide layer which is conformal with exposed inner walls of the deep trench. Form a gate conductor in the deep trench above the trench top oxide layer. Recess the gate conductor below the bottom surface of the bit line diffusion region. Perform angled ion implantation at a greater angle θ+δ with respect to vertical of a counter-dopant into the channel below the location of the bit line diffusion region and perform angled ion implantation at a lesser angle θ with respect to vertical of a dopant into the channel below the location of the drain region. Preferably, the lesser angle θ is about 7° and the greater angle θ+δ is about 30°.; the counterdopant is selected from the group consisting of arsenic and phosphorus; and/or the counterdopant comprises arsenic ions implanted at an energy of about 10 keV.

BRIEF DESCRIPTION OF DRAWINGS

The foregoing and other aspects and advantages of this invention are explained and described below with reference to the accompanying drawings, in which.

DETAILED DESCRIPTION

Figure 3:
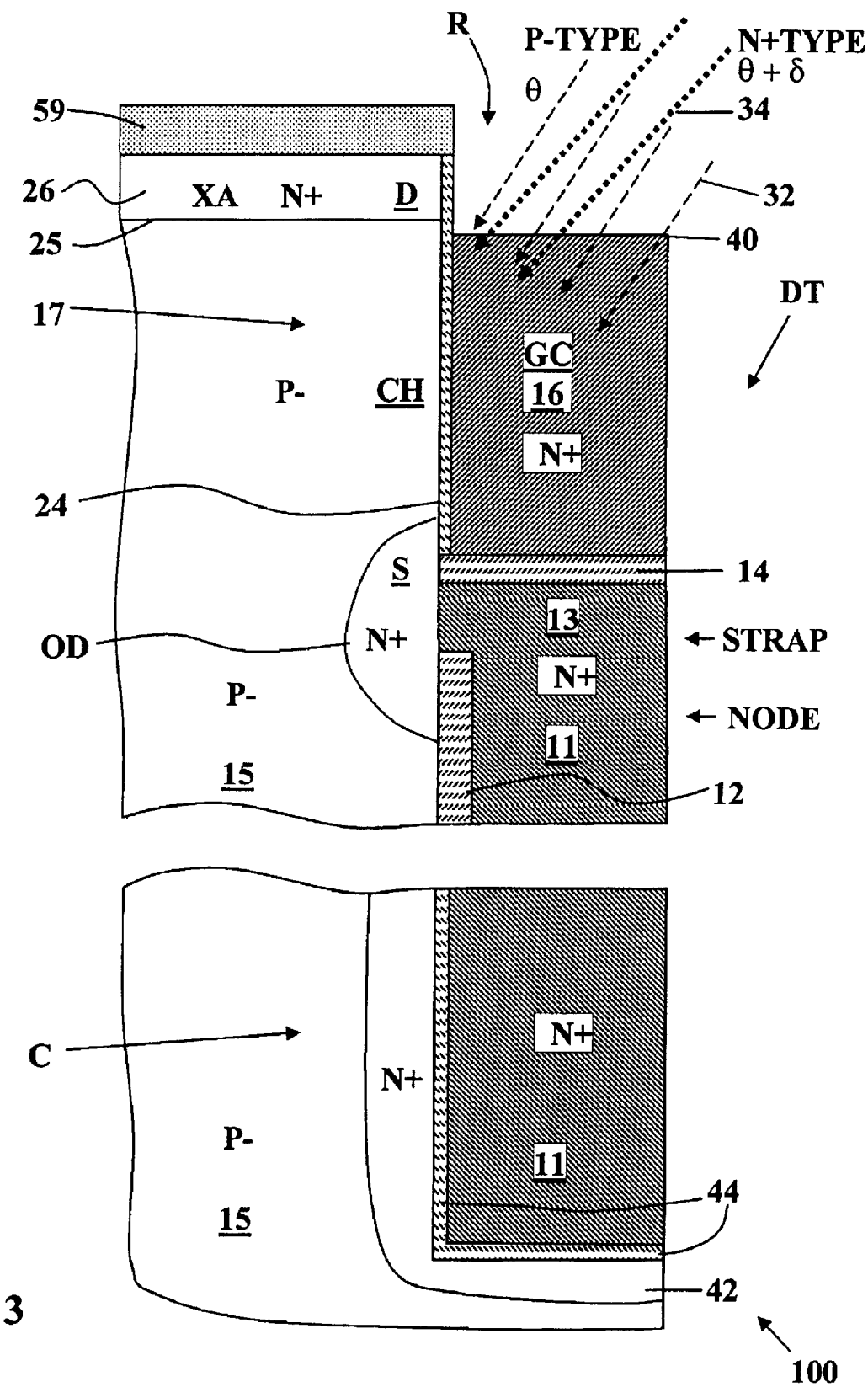
FIG. 3 illustrates a device structure and the Vt adjustment implant process in accordance with this invention.

FIG. 3 illustrates a device structure and the Vt adjustment implant process in accordance with this invention with the N+ doped bit line diffusion XA region 26 shown at the top of the semiconductor substrate 15 while angled ion implantations 32 and 34 are being performed. It is possible that the XA region 26 is formed later in the manufacturing process, but the resulting channel doping levels are the same.

Figure 1A:
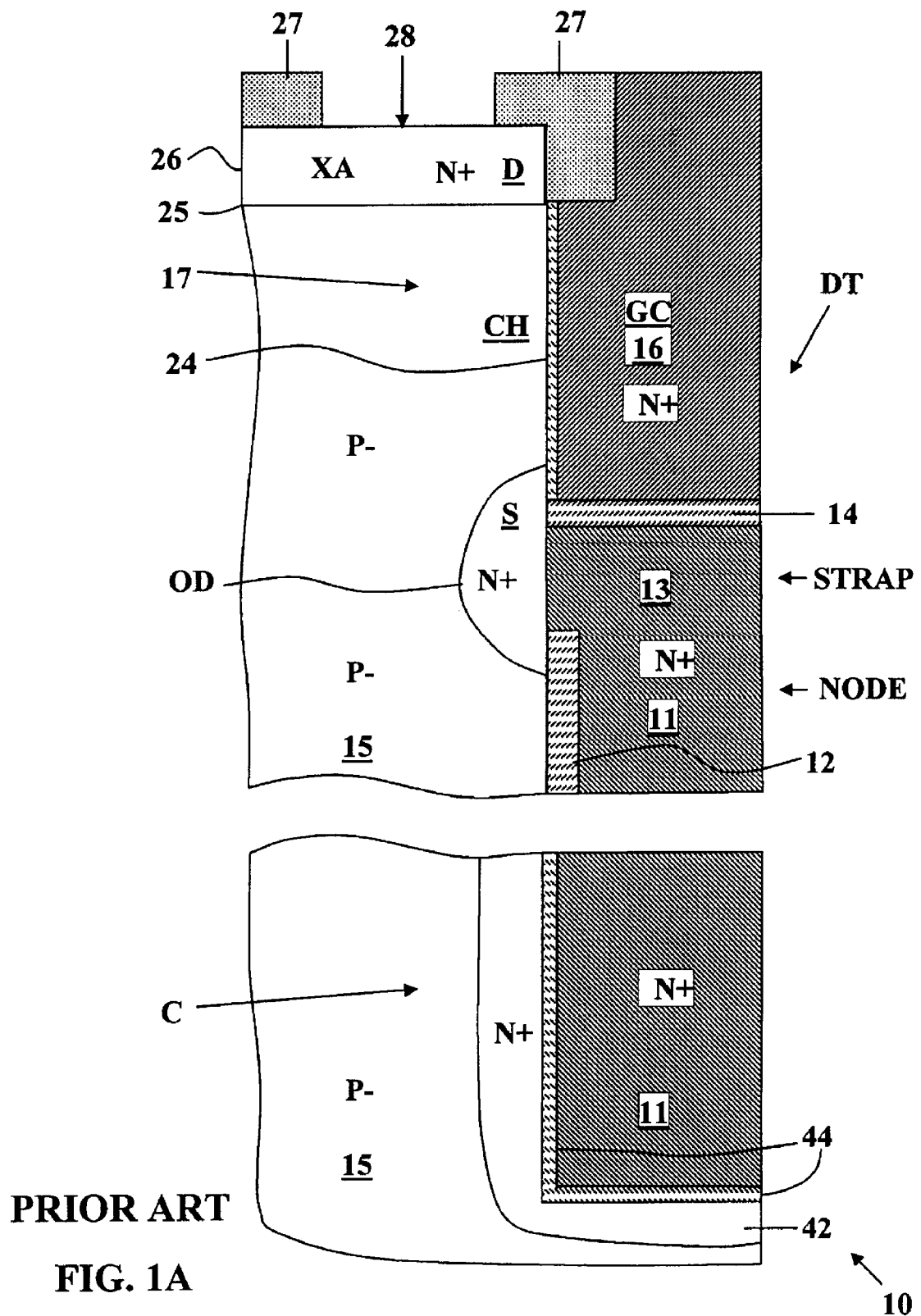
FIG. 1A is fragmentary, schematic, vertical sectional elevational view of a prior art vertical, deep trench, MOSFET, DRAM cell 10 formed in a P– doped silicon substrate.
Figure 1B:
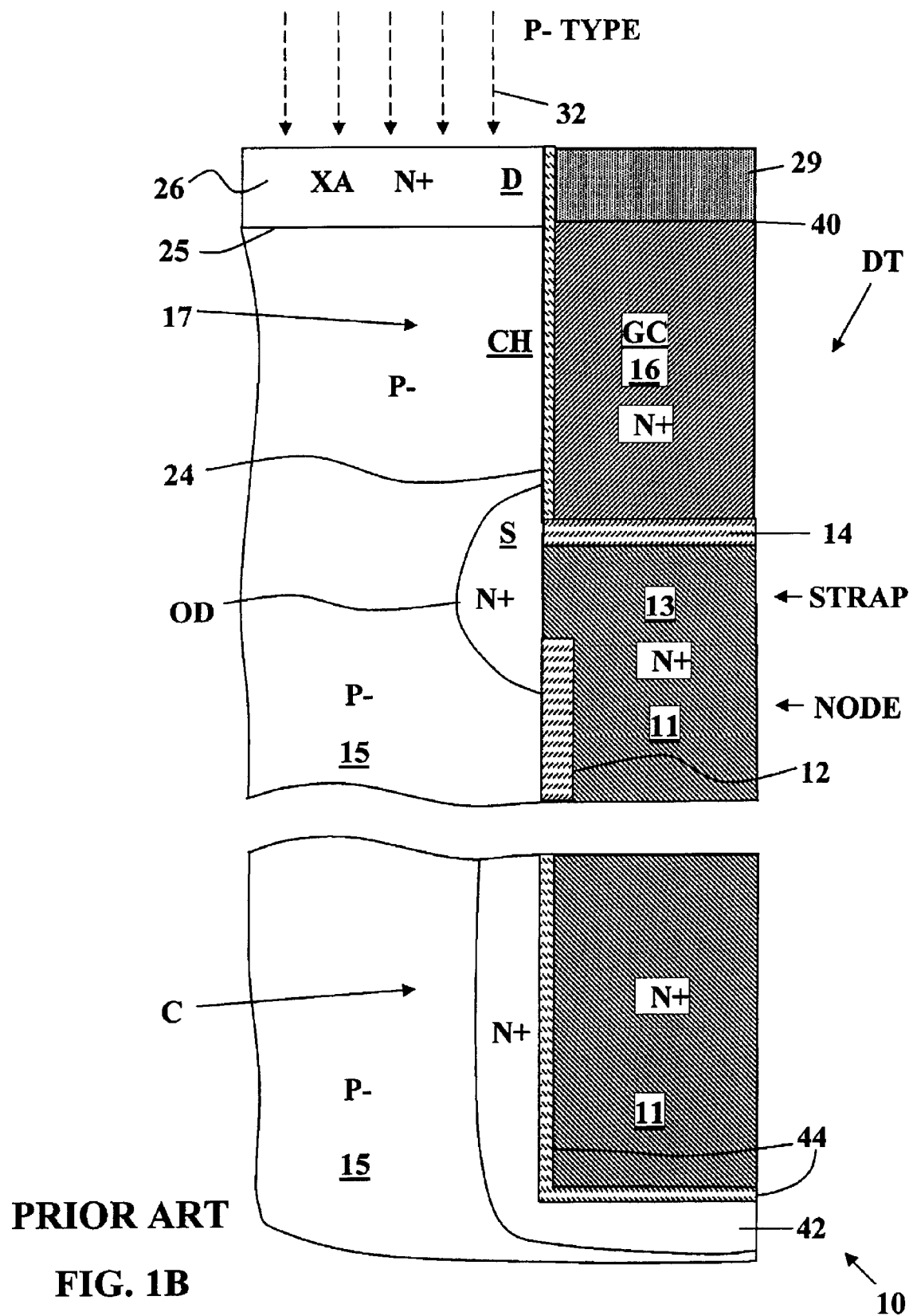
FIG. 1B illustrates by implanting dopant into the P– doped silicon substrate including the channel region of the vertical pass transistor cell of FIG. 1A to provide a Vt adjustment implant therein.
Figure 2A:
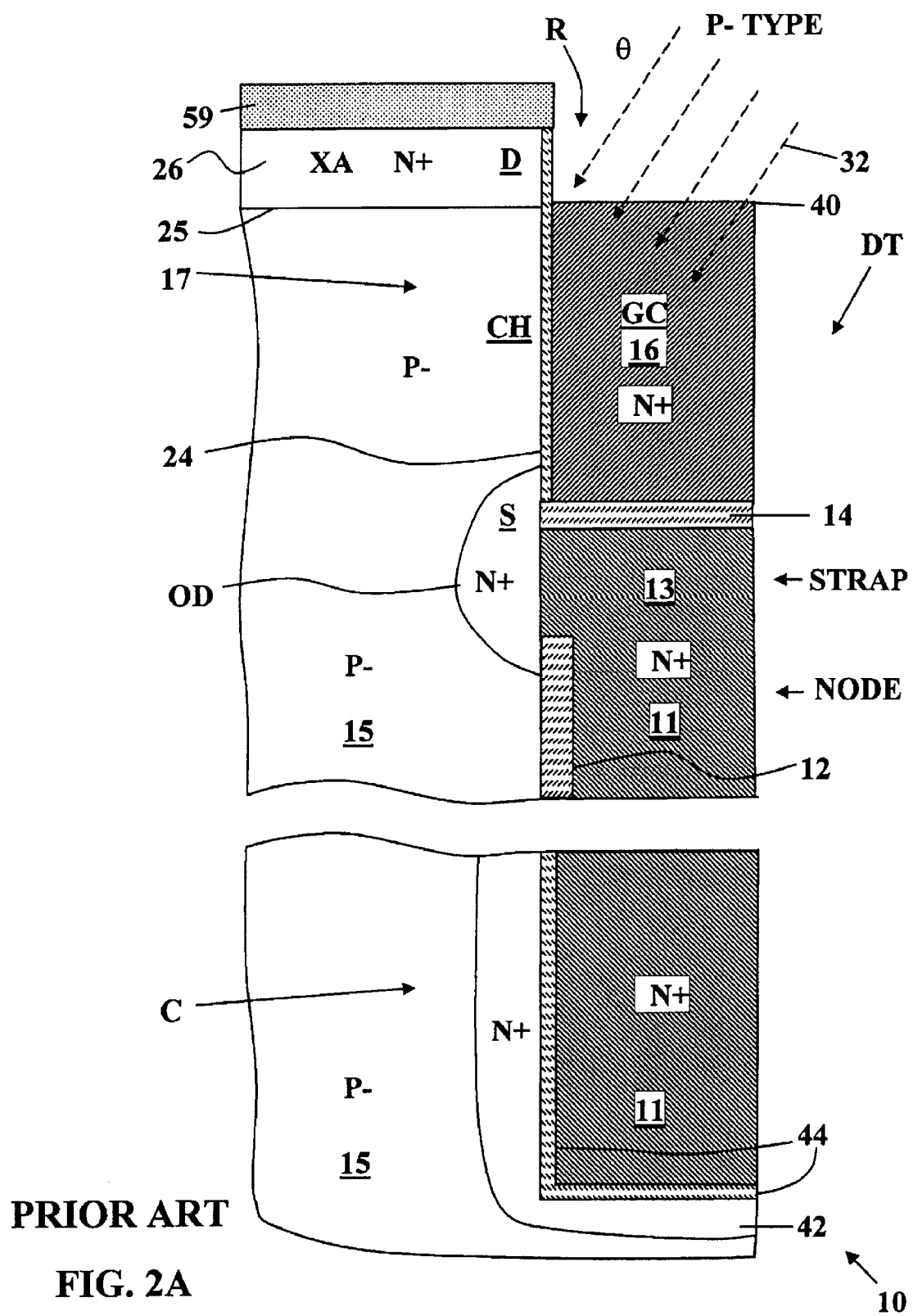
FIG. 2A illustrates a solution to the problem of the process of FIG. 1B, which is to perform on the cell of FIG. 1A Vt adjustment by an angled ion implantation of P type dopant ions into and through a recessed gate conductor composed of N+ doped polysilicon.
Figure 2B:
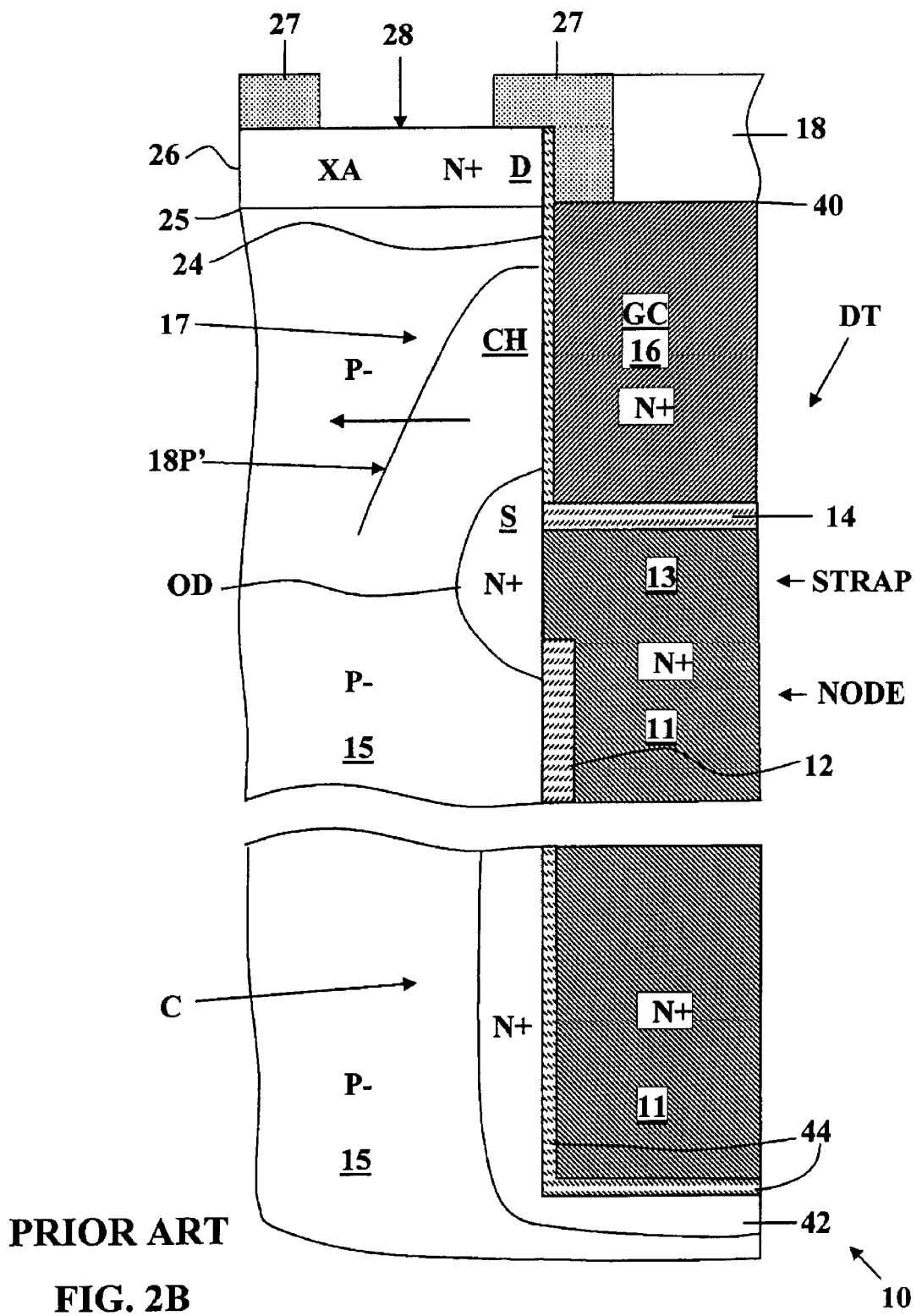
FIG. 2B shows the cell of FIG. 1A after the process of angled ion implantation of P type dopant ions performed in FIG. 2A has resulted in lateral scattering of the implanted P type dopant atoms as illustrated by a solid profile line marked with a horizontal arrow.
Figure 2C:
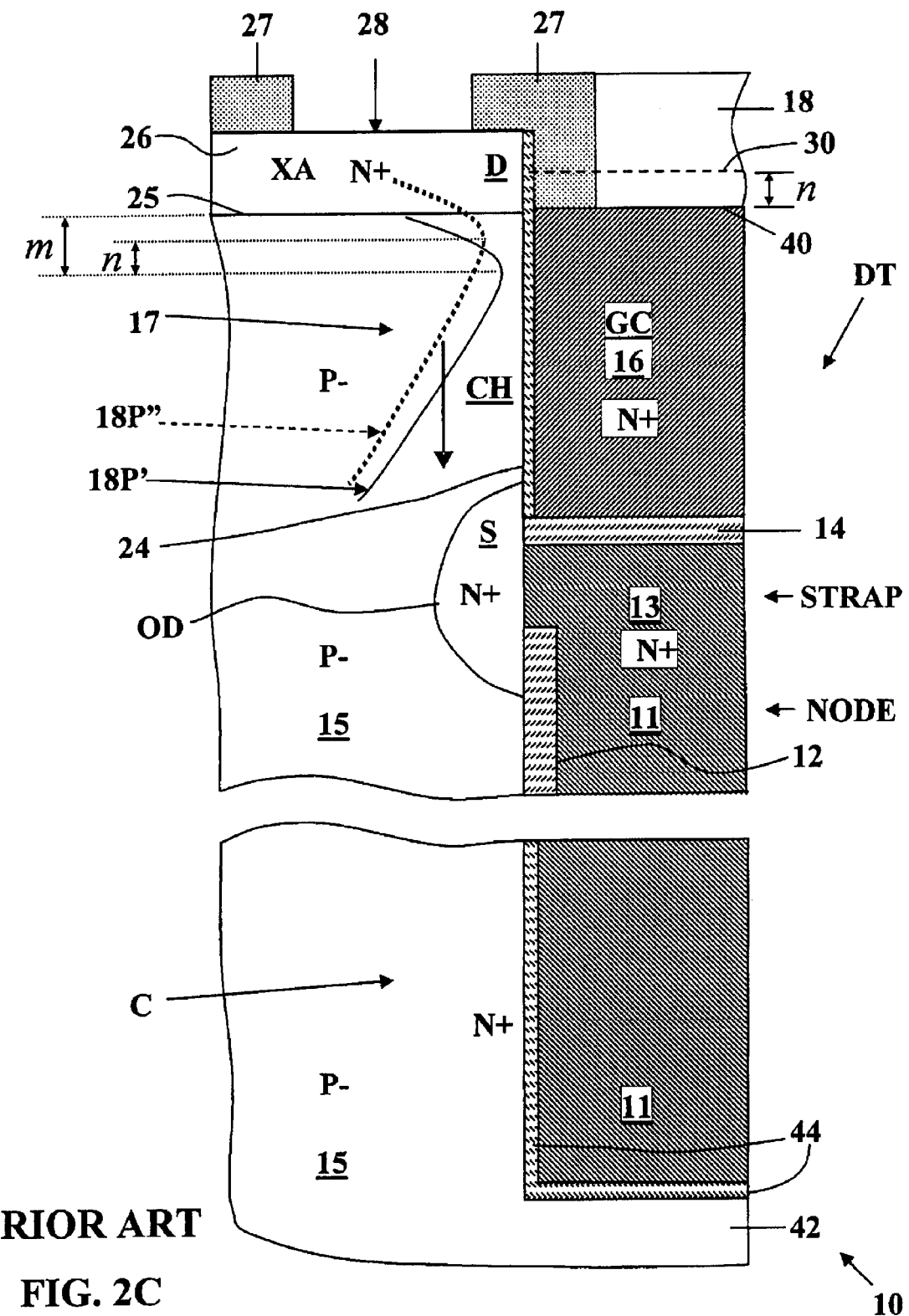
FIG. 2C shows there is also a vertically graded solid profile line of P-type dopant produced by the process illustrated by FIG. 2A plus a hypothetical dotted line of a graded vertical profile of P-type dopant caused by too shallow a recessing of the gate conductor.
Figure 2D:
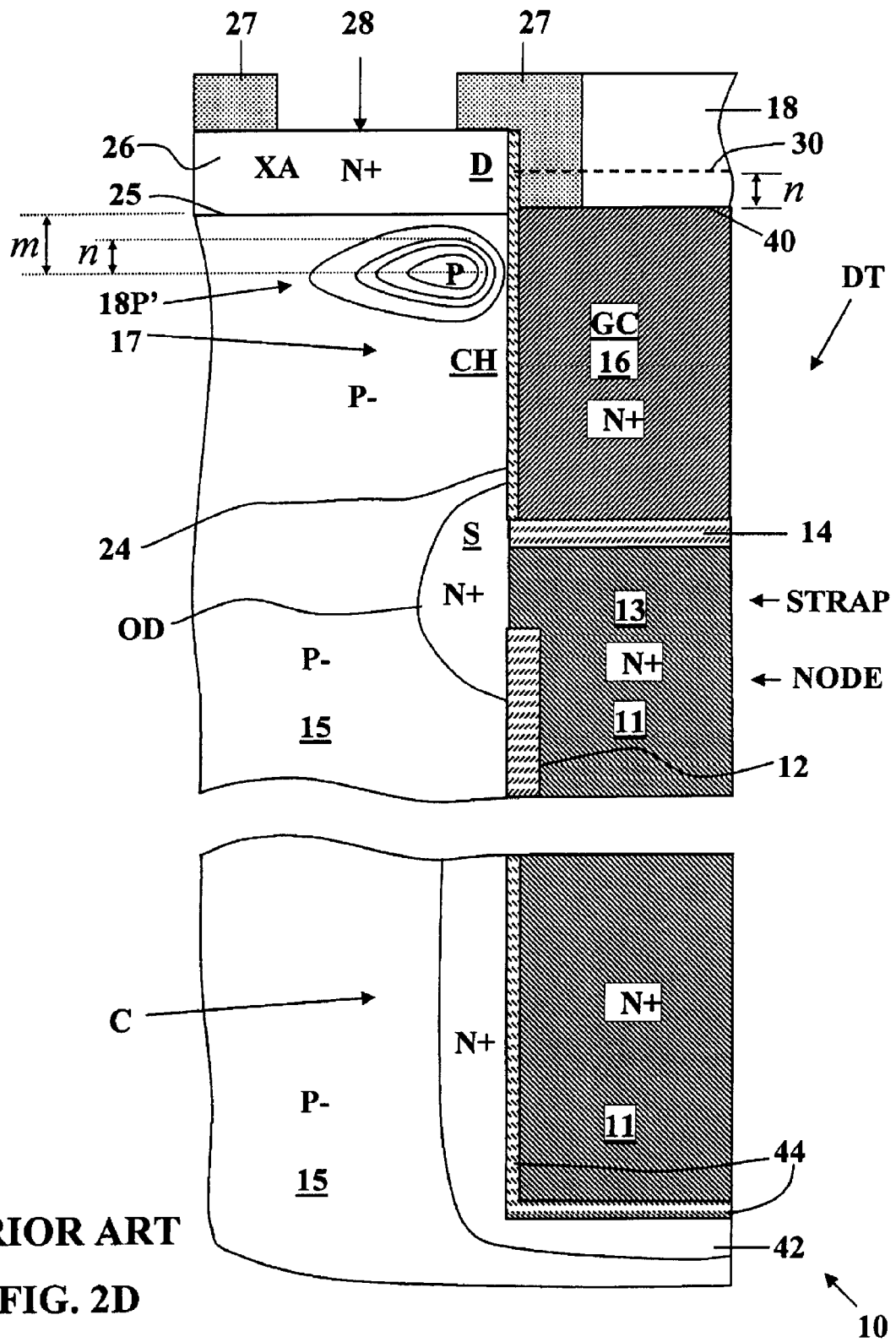
FIG. 2D shows a desirable composite "three-dimensional" profile (vertical and horizontal distribution) of the concentration levels of the p type dopant atoms implanted in the step illustrated by FIG. 2A with the gate conductor recessed to the level shown in FIGS. 2A and 2B.
Figure 2E:
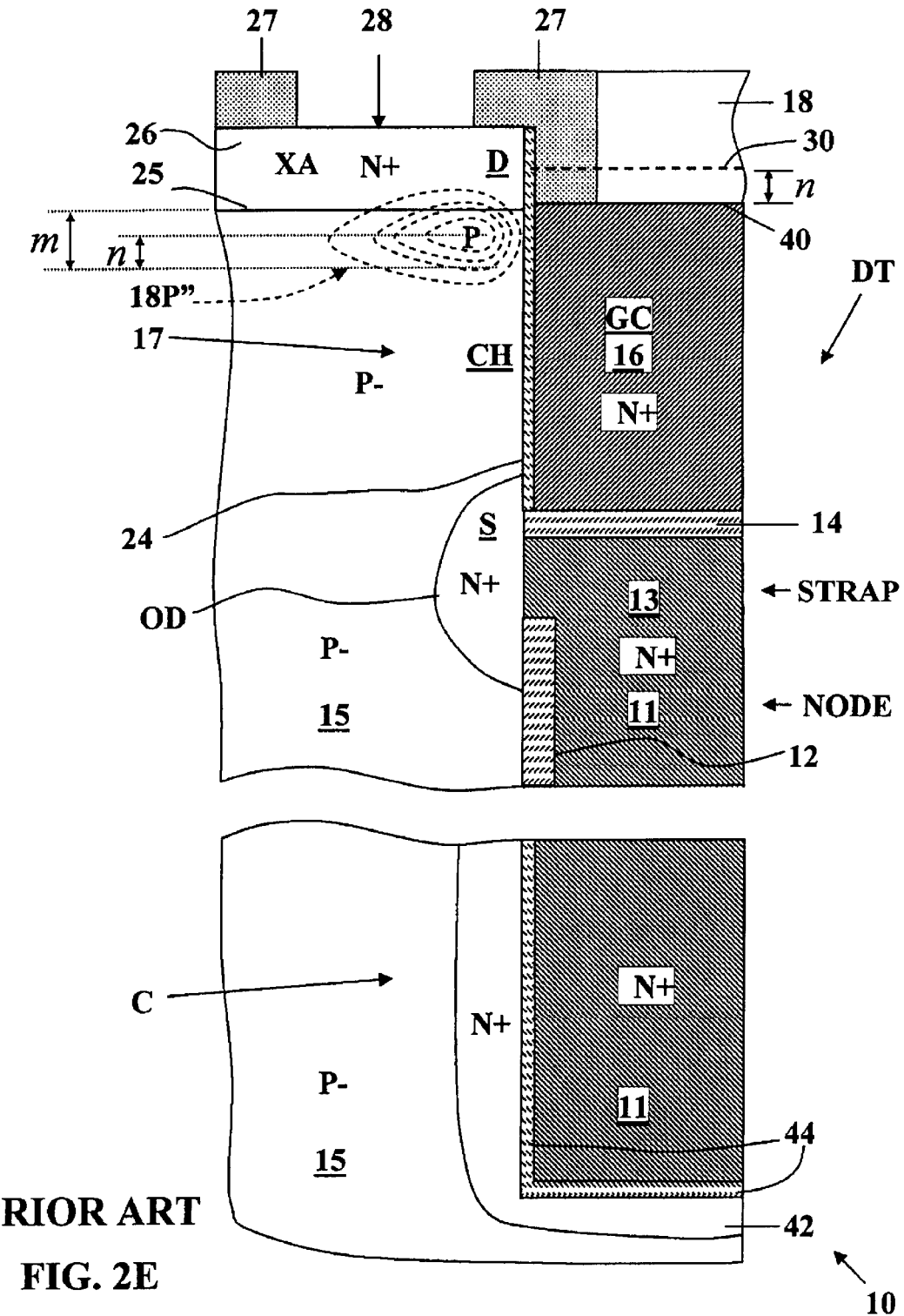
FIG. 2E shows the undesirable profile in the form of a composite "three-dimensional" (vertical and horizontal distribution) of the concentration levels of the P type dopant atoms implanted in the step illustrated by FIG. 2A, but with the gate conductor recessed to the hypothetical dotted line level at which the gate recess level is too high, i.e. at an unacceptably high level.

In accordance with this invention, the solution to the problem of FIGS. 2C and 2E is illustrated by FIG. 3 in which a Vt adjustment by an angled ion implantation of P-type dopant 32 has been provided into the recessed gate electrode 16 composed on N+ doped polysilicon implanted at the lesser angle θ with respect to vertical and the lateral scattering of the energetic ions combined with diffusion creates a laterally graded profile as illustrated by dopant profile 18P" or 18P''' in FIG. 2C combined with an implant of N-type dopant ions 34 at a greater angle θ+δ with respect to vertical which compensates for P-type ions implanted into the channel CH just below the drain region D. While relatively heavy P-type doping into the channel below the drain region D is needed to suppress the sub-Vt leakage, as explained above, it must not be substantial near the dram region CH. On the other hand, a P-type doping level near the buried strap out-diffusion region OD needs to remain low since high doping level leads to excessive junction leakage. As a result, it is also advantageous to dope the channel region non-uniformly in the vertical direction.

With the process of this invention, the pass transistor XA 26 junction is defined by implant energy only and is self-aligned to the recessed gate edge regardless of the gate recess variation. It has been found that Vt variation can be greatly reduced while the channel length can be further scaled down by about 50 nm.

Figure 4:
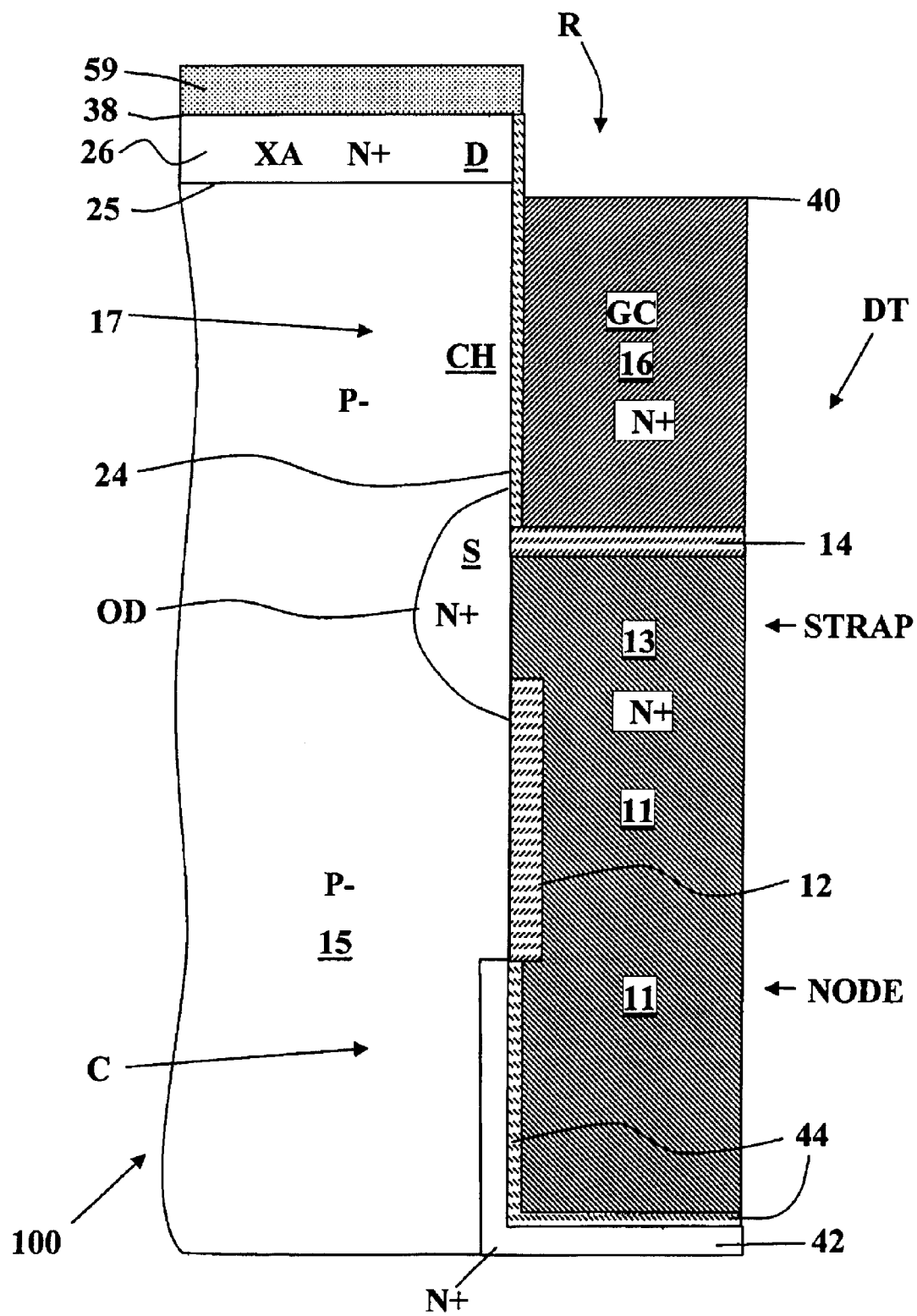
FIG. 4 shows that the result of the process of this invention is the same as prior art process up to step (12) below.

FIG. 4 shows that the result of the process of this invention is the same as prior art process up to step (12) below.

(1) starting with a silicon substrate 15, a pad structure 38 consisting of a thin thermal oxide (2–20 nm) is grown on the silicon substrate 15; a deposited pad masking layer 59 composed of silicon nitride (50–200 nm), and a layer of densified TEOS oxide (or HDP oxide) (50–500 nm). Then a top layer of BSG oxide (50–500 nm) is deposited.

(2) Deep trench storage capacitors C are then formed in the customarily practiced manner by opening the pattern of the deep trench DT in the masking layer 59 and the pad structure 38 and anisotropically etching the P– doped silicon substrate 15 to a depth of approximately 7 micrometers.

(3) An N+ counterdoped buried plate 42 is formed by diffusion of N-type dopant through the lower portion of the deep storage trench DT into the surrounding region of the substrate 15, using anyone of a number of well known methods (e.g. out-diffusion from an ASG glass, gas phase doping and the like).

(4) A conformal storage node dielectric layer 44 composed of silicon oxide is formed as a thin film on the inner walls of the deep trench DT.

(5) The deep trench DT is filled with N+ doped polysilicon forming the lower portion of the storage node 11 which is then recessed to form a conformal polysilicon buffered LOCOS collar 12 on the inner walls of the deep trench DT or other type of dielectric collar 12 above the storage node dielectric layer 44 and the lower portion of the storage node 11 in the upper portion (approximately top 1 micrometer). The upper portion of the sidewalls of the deep trench DT remain exposed to the P− doped silicon substrate 15 leaving the top of the dielectric collar 12 recessed well below the top of the deep trench DT.

(6) Then the deep trench DT is refilled with N+ doped polysilicon and planarized to the level of the pad masking layer 59 to complete formation of the storage node 11. The polysilicon of the storage node 11 is then recessed to a depth below the surface of the silicon substrate at which it is desired to form a buried-strap 13 in the upper surface of the storage node 11 above the top of the dielectric collar 12. The recess can be made about 5 nm shallower than prior art due to the present invention. This also translates to about a 5 nm channel length reduction and about a 20% drive current improvement.

(7) A standard buried-strap process is used to form a buried strap out-diffusion region OD in the P− doped silicon substrate 15 by buried strap out-diffusion of N type dopant from the N+ polysilicon in strap 13 through the sidewall of the deep storage trench. The standard strap process includes the removal of the collar oxide 12 from the side of the deep trench DT above the point at which the strap 13 is to be formed, and the deposition and etching of the doped strap polysilicon 13. The strap polysilicon 13 electrically bridges the N+ doped polysilicon of the storage node 11 in the deep trench DT (storage node electrode of the capacitor) to the P− doped, single crystal silicon substrate 15 adjacent to the deep storage trench. A buried strap N+ doped out-diffusion region OD is subsequently formed by buried strap out-diffusion of N type dopant from N+ doped polysilicon strap 13 in the course of processing at elevated temperatures.

(8) A trench top oxide (TTO) layer 14 is formed on the top surface of the recessed N+ doped polysilicon strap region 14 by HDP deposition of the silicon oxide.

(9) A conformal thin film of silicon oxide is grown on the exposed sidewall of the deep trench DT to form the gate oxide layer 24 of the vertical array FET transistor 17.

(10) N+ polysilicon gate conductor (GC) 16 is deposited, filling the aperture in the trench above the TTO layer 14.

(11) The N+ doped polysilicon GC 16 is then planarized to the surface of TTO layer 14 which had been formed on the top surface of the P− doped silicon substrate 15.

(12) Up to this point the process is similar to that of FIGS. 1A–1B and 2A–2E, but now the gate conductor GC 16 is recessed below the lower level of bit line diffusion (XA) region 26. For that reason, the array polysilicon GC 16 is recessed to form a recess R reaching to a depth indicated by line 40 below the bottom surface of the XA region 26 of the silicon substrate 15 using standard etch techniques to expose the gate oxide layer 24 of the FET transistor 17 between the top of the gate conductor GC 16 and channel CH. Otherwise, the processing is standard except that a shallower device recess depth can be used for length scaling of the channel CH.

(13) As in FIG. 3, an angled ion implantation of an N-type dopant species at a greater angle θ+δ with respect to vertical is made through the exposed gate oxide layer 24 in recess R and into the deep trench sidewall to form N-type doping pockets. The N-type dopant can be either phosphorus (P) or arsenic (As), with arsenic being the preferred dopant because of the heavy mass thereof. The preferred energy for ion implantation of arsenic into the channel region CH is about 10 keV, in order to avoid overcompensation of the P-type Vt adjustment doping with dopant 32.

Another angled ion implantation of P-type dopant 32 at a lesser angle θ with respect to vertical is subsequently made through the recessed polysilicon of the gate conductor 16 and the sidewall of deep trench DT and gate oxide layer 24. Since both implants are self-aligned to the edge of the gate conductor 16, a p-n junction is formed and self-aligned to the gate edge as well. The implant species, energy and dose are chosen such that the junction is placed just below the level 40 of the recessed GC edge and the threshold voltage Vt is sufficient to suppress sub-threshold leakage current. Preferably, the lesser angle θ is about 7° and the greater angle θ+δ is about 30°.

(14) Following step (13), standard processing techniques are applied to form active area (AA), fill Shallow Trench Isolation (STI), form the XA region 26 by doping with N-type dopant after removal of the hard mask, form wordlines, bitline studs, interlevel dielectrics and additional wiring levels and the like. Alternatively, the XA region 26 can be formed prior to performing the angled ion implantation of P-type ions 32 and N-type ions 34 into the channel region.

Figure 5:
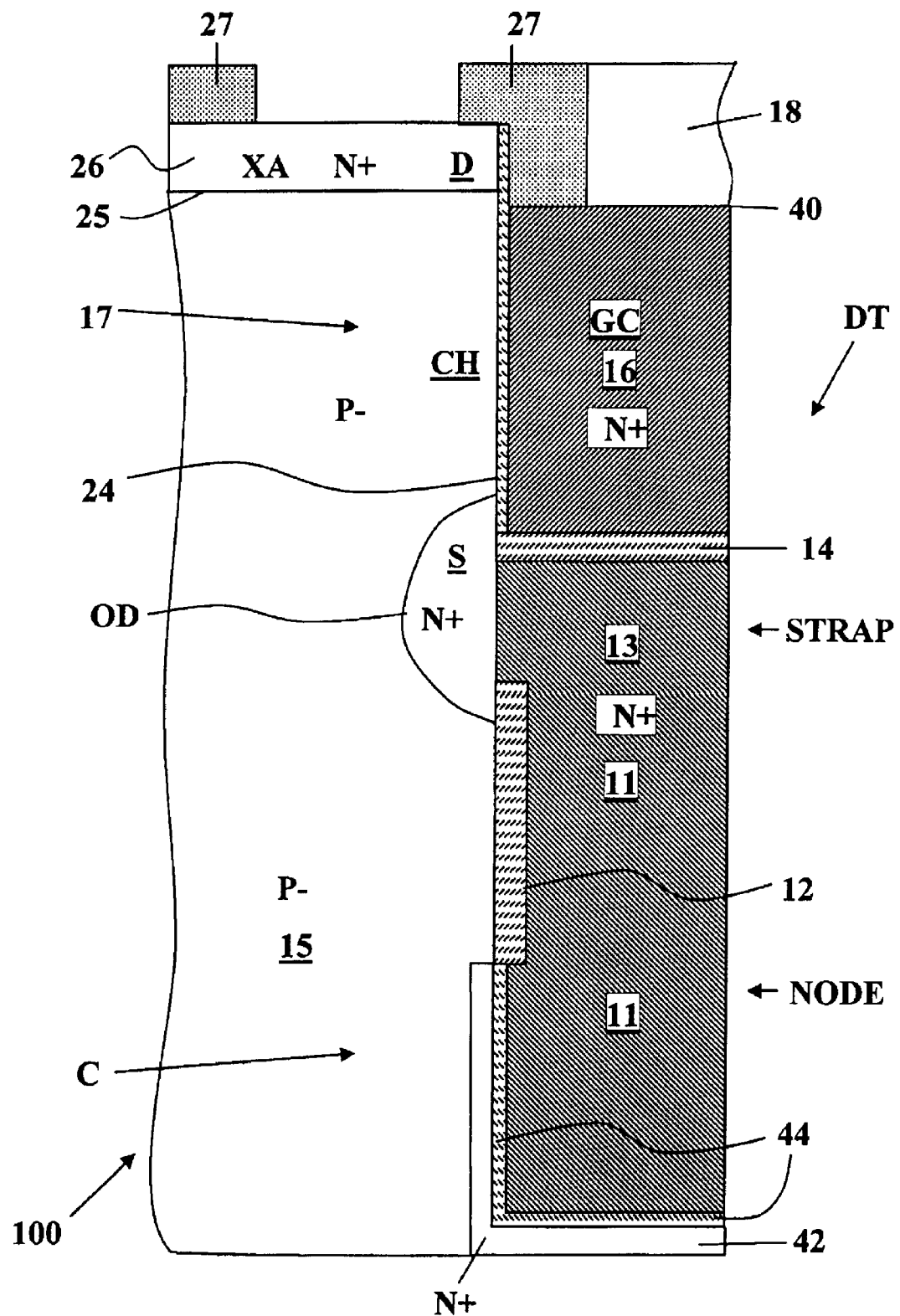
FIG. 5 shows a completed DRAM cell manufactured in accordance with the method of this invention.

The completed DRAM cell 100 is shown in FIG. 5.

While this invention has been described in terms of the above specific embodiment(s), those skilled in the art will recognize that the invention can be practiced with modification within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of formation of a trench vertical transistor in a semiconductor substrate having a surface and a trench with a sidewall formed in said semiconductor substrate, said semiconductor substrate being doped with a dopant, a counterdoped drain region in the surface of said substrate and a channel alongside said sidewall, said drain region having a top level and a bottom level, a counterdoped source region formed in the substrate juxtaposed with said sidewall below said channel, a gate oxide layer formed on the sidewalls of said trench, and a gate conductor formed in said trench, said method including the steps as follows:

recessing said gate conductor below said surface of said semiconductor substrate;

performing angled ion implantation at a greater angle θ+δ with respect to vertical of a counterdopant into said channel below the location of said drain region; and performing angled ion implantation at a lesser angle θ with respect to vertical of a dopant into said channel below said location of said drain region.

2. The method of claim 1 wherein said recessing of said gate conductor reaches below said bottom level of said drain region.

3. The method of claim 1 wherein the lesser angle θ is about 7° and the greater angle θ+δ about 30°.

4. The method of claim 1 wherein said counterdopant is selected from the group consisting of arsenic and phosphorus.

5. The method of claim 3, wherein said counterdopant comprises arsenic ion implanted at an energy of about 10 keV.

6. The method of claim 5 wherein the lesser angle θ is about 7° and the greater angle θ+δ is about 30°.

7. The method of claim 1 wherein:

said deep trench includes a deep trench capacitor; and said recessing of said gate conductor reaches below said bottom level of said drain region.

8. The method of claim 7 wherein the lesser angle θ is about 7° and the greater angle θ+δ is about 30°.

9. A method of formation of a deep trench vertical transistor in a semiconductor substrate having a surface and a trench with a sidewall formed in said semiconductor substrate, said deep trench including a deep trench capacitor filled with a node, a strap, a collar and a node dielectric lining said deep trench, and a buried plate formed in the semiconductor substrate surrounding said deep trench, said semiconductor substrate being doped with a dopant, a counterdoped bit line diffusion region in the surface of said substrate and a channel alongside said sidewall, said bit line diffusion region having a top level and a bottom level, a counterdoped source region formed in the substrate juxtaposed with said sidewall below said channel, a gate oxide layer formed on the sidewalls of said trench, and a gate conductor formed in said trench, said method including the steps as follows:

recessing said gate conductor below said surface of said semiconductor substrate;

performing angled ion implantation at a greater angle θ+δ with respect to vertical of a counterdopant into said channel below the location of said drain region; and performing angled ion implantation at an the lesser angle δ with respect to vertical of a dopant into said channel below said location of said bit line diffusion region.

10. The method of claim 9 wherein said recessing of said gate conductor reaches below said bottom level of said bitline diffusion region.

11. The method of claim 9 wherein the lesser angle δ is about 7° and the greater angle θ+δ is about 30°.

12. The method of claim 9 wherein said counterdopant is selected from the group consisting of arsenic and phosphorus.

13. The method of claim 11, wherein said counterdopant comprises arsenic ion implanted at an energy of about 10 keV.

14. The method of claim 12 wherein the lesser angle θ is about 70° and the greater angle θ+δ is about 30°.

15. A method of formation of a deep trench vertical transistor in a semiconductor substrate having a surface and a deep trench with a sidewall formed in said semiconductor substrate and a bit line diffusion region juxtaposed therewith on the surface of said semiconductor substrate, comprising the steps as follows:

forming a deep trench having a top and a lower portion in a doped semiconductor substrate; forming a counterdoped buried plate in said substrate surrounding said lower portion of said deep trench;

forming a storage node dielectric layer as a conformal thin film on inner walls of said deep trench;

filling said deep trench with an initial storage node conductor which is counterdoped;

recessing the initial storage conductor;

forming a dielectric collar as a conformal film on exposed inner walls of said deep trench with said dielectric collar recessed below said top of said deep trench;

filling said deep trench with a complementary storage node conductor which is counterdoped above and in contact with said initial storage conductor;

recessing said complementary storage node conductor to a buried strap level in said deep trench;

forming a counterdoped buried strap counterdoped outdiffusion by diffusion of dopant from said complementary storage node conductor into said substrate;

forming a trench top oxide layer over said complementary storage node conductor;

forming a gate oxide layer which is conformal with exposed inner walls of said deep trench;

forming a gate conductor in said deep trench above said trench top oxide layer;

recessing the gate conductor below the bottom surface of the bit line diffusion region, and performing angled ion implantation at a greater angle θ+δ with respect to vertical of a counterdopant into said channel below the location of said bit line diffusion region; and performing angled ion implantation at a lesser angle θ with respect to vertical of a dopant into said channel below said location of said drain region.

16. The method of claim 15 wherein the lesser angle θ is about 7° and the greater angle θ+δ is about 30°.

17. The method of claim 15 wherein said counterdopant is selected from the group consisting of arsenic and phosphorus.

18. The method of claim 17 wherein the lesser angle θ is about 7° and the greater angle θ+δ is about 30°.

19. The method of claim 17, wherein said counterdopant comprises arsenic ions implanted at an energy of about 10 keV.

20. The method of claim 19 wherein the lesser angle θ is about 7° and the greater angle θ+δ is about 30°.

* * * * *